United States Patent
Chaji (10) Patent No.: US 10,680,043 B2
(45) Date of Patent: *Jun. 9, 2020

(54) HIGH PIXEL DENSITY ARRAY ARCHITECTURE

(71) Applicant: Ignis Innovation Inc., Waterloo (CA)

(72) Inventor: Gholamreza Chaji, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/198,842

(22) Filed: Nov. 22, 2018

(65) Prior Publication Data

US 2019/0096963 A1 Mar. 28, 2019

Related U.S. Application Data

(63) Continuation of application No. 15/811,206, filed on Nov. 13, 2017, now Pat. No. 10,170,522, which is a continuation of application No. 14/953,527, filed on Nov. 30, 2015, now Pat. No. 9,842,889.

(30) Foreign Application Priority Data

Nov. 28, 2014 (CA) ...................... 2872563

(51) Int. Cl.
*H01L 27/32* (2006.01)
*G09G 3/36* (2006.01)
*H01L 51/56* (2006.01)

(52) U.S. Cl.
CPC ....... *H01L 27/3218* (2013.01); *G09G 3/3607* (2013.01); *H01L 27/3213* (2013.01); *H01L 51/56* (2013.01)

(58) Field of Classification Search
CPC .............. G09G 3/3607; H01L 27/3218; H01L 27/3213
USPC .......................................... 257/40; 345/581
See application file for complete search history.

(56) References Cited

U.S. PATENT DOCUMENTS 10,170,522 B2 * 1/2019 Chaji .................. H01L 27/3218
2014/0077186 A1 * 3/2014 Kim .................... H01L 27/3218
257/40

* cited by examiner

*Primary Examiner* — David Vu
*Assistant Examiner* — Brandon C Fox
(74) *Attorney, Agent, or Firm* — Stratford Managers Corporation (57) ABSTRACT

What is disclosed is a pixel array architecture for displays being based on a matrix of subpixels arranged in a rectilinear matrix oriented at an angle relative to a horizontal direction of the display, exhibiting a reduced pixel pitch for the subpixels.

19 Claims, 13 Drawing Sheets

HIGH PIXEL DENSITY ARRAY ARCHITECTURE

CROSS REFERENCE TO RELATED APPLICATION

This application is a continuation of U.S. patent application Ser. No. 15/811,206, filed Nov. 13, 2017, now allowed, which is a continuation of U.S. patent application Ser. No. 14/953,527, filed Nov. 30, 2015, now U.S. Pat. No. 9,842,889, which claims priority to Canadian Application No. 2,872,563, filed Nov. 28, 2014, each of which is hereby incorporated by reference herein in its entirety.

FIELD OF THE INVENTION

The present disclosure relates to pixel array architectures in visual display technology, and particularly to pixel array architectures for high density active matrix light emitting diode device (AMOLED) and other high density displays.

BRIEF SUMMARY

According to a first aspect there is provided a pixel array architecture of a display, the pixel array architecture comprising a matrix of subpixels grouped into pixels, the matrix of subpixels arranged in a rectilinear matrix oriented at an angle relative to a horizontal direction of the display, exhibiting a reduced pixel pitch for the subpixels.

In some embodiments, the reduced pixel pitch is less than or equal to a factor of $(½)^{1/2}$ times a pixel pitch of a substantially similar rectilinear matrix oriented at 0 degrees relative to the horizontal direction of the display, and wherein the angle is 45 degrees.

In some embodiments, the rectilinear matrix is substantially a square matrix.

In some embodiments, the subpixels are arranged into pixels, and the pixels arranged into rows and columns, each pixel having three subpixels and formed into a "v" shape oriented in one of a first direction and a second direction opposite from the first direction.

In some embodiments, the pixels are arranged one atop each other in columns such that alternating columns comprise pixels having "v" shapes oriented in opposite directions.

In some embodiments, each subpixel is shaped in the form of a square oriented at one of 0 degrees and 45 degrees from the horizontal direction of the display, and wherein each pixel comprises a green subpixel, a blue subpixel, and a red subpixel.

In some embodiments, the subpixels are arranged into pixels, and the pixels arranged into rows and columns, each pixel having three subpixels and formed into a slanted "I" shape.

In some embodiments, the pixels are formed into an "I" shape slanted at 45 degrees relative to the horizontal direction.

In some embodiments, the pixels are arranged in columns in a repeating pattern, in groups of two, one atop each other and overlapping only by two subpixels, with a vertical gap of a single subpixel in height between groups, the gap including a subpixel of a pixel of each neighboring column.

In some embodiments, each subpixel is shaped in the form of a square oriented at one of 0 degrees and 45 degrees from the horizontal direction of the display, and wherein each pixel comprises a green subpixel, a blue subpixel, and a red subpixel.

In some embodiments, the pixels are formed into "I" shapes slanted in one of a positive 45 degree slope and a negative 45 degree slope.

In some embodiments, the pixels are arranged in columns in a repeating pattern, one atop each other, alternating in slant form negative 45 degrees to positive 45 degrees, overlapping only by two subpixels, forming a snaking vertical pattern identical in geometry to a pattern of adjacent columns.

In some embodiments, the pixels are arranged in columns in a repeating pattern, one atop each other, alternating in slant form negative 45 degrees to positive 45 degrees, overlapping only by two subpixels, forming a snaking vertical pattern, wherein for one of the odd or even columns, each upper pixel sits atop a pixel below it on a longest side of the pixel below, wherein for the other of the odd or even columns an upper pixel sits atop a pixel below it on a shortest side of the pixel below.

In some embodiments, the subpixels are arranged into pixels, and the pixels arranged into rows and columns, each pixel having four subpixels and formed into a diamond shape, a first and a second of the four subpixels unshared with neighboring pixels, a third and a fourth subpixel of the four subpixels shared with neighboring pixels.

In some embodiments, the pixels are arranged in columns in a repeating pattern, one atop each other, overlapping only by two subpixels, forming a snaking vertical pattern identical in geometry to a pattern of adjacent columns, the leftmost and rightmost pixel of each pixel being shared with its respective left and right neighbor pixel.

In some embodiments, the first and second unshared subpixels are a green and a white subpixel and wherein the third and fourth shared subpixels are a red and a blue subpixel.

According to another aspect there is provided a pixel array architecture of a display, the pixel array architecture comprising a matrix of subpixels grouped into pixels arranged in rows and columns, the matrix of subpixels arranged based on a rectilinear matrix oriented at 45 degrees relative to a horizontal direction of the display, subsequently skewed to vertically align subpixels in every third subpixel row, exhibiting a reduced pixel pitch for the subpixels.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

DETAILED DESCRIPTION

Pixel array arrangements and architectures are important for today's high density visual display technologies. One performance metric of such displays is the "pixel pitch" which is the nearest neighbor horizontal or vertical distance between subpixel elements, typically, although not limited to red, green, and blue subpixel elements which make up pixels common of modern displays.

While the embodiments described herein will be in the context of high density AMOLED displays it should be understood that the pixel array architectures described herein are applicable to any other display comprising pixels each having a plurality of subpixels, including but not limited to liquid crystal displays (LCD), light emitting diode displays (LED), electroluminescent displays (ELD), organic light emitting diode displays (OLED), plasma display panels (PSP), among other displays.

It should be understood that the embodiments described herein pertain to subpixel and pixel array architectures and do not limit the display technology underlying their operation and the operation of the displays in which they are implemented. Implementation of various types of visual display technologies for designing, manufacturing, and driving the displays comprising the subpixels and pixels in the architectures described herein are well beyond the scope of this document but are nonetheless known to persons having skill in the art. Patents which describe innovative technologies in relation to high resolution AMOLED displays include U.S. Pat. Nos. 8,552,636, 8,803,417, and 9,059,117, each entitled "High Resolution Pixel Architecture" and granted to Chaji et al.

Figure 1:
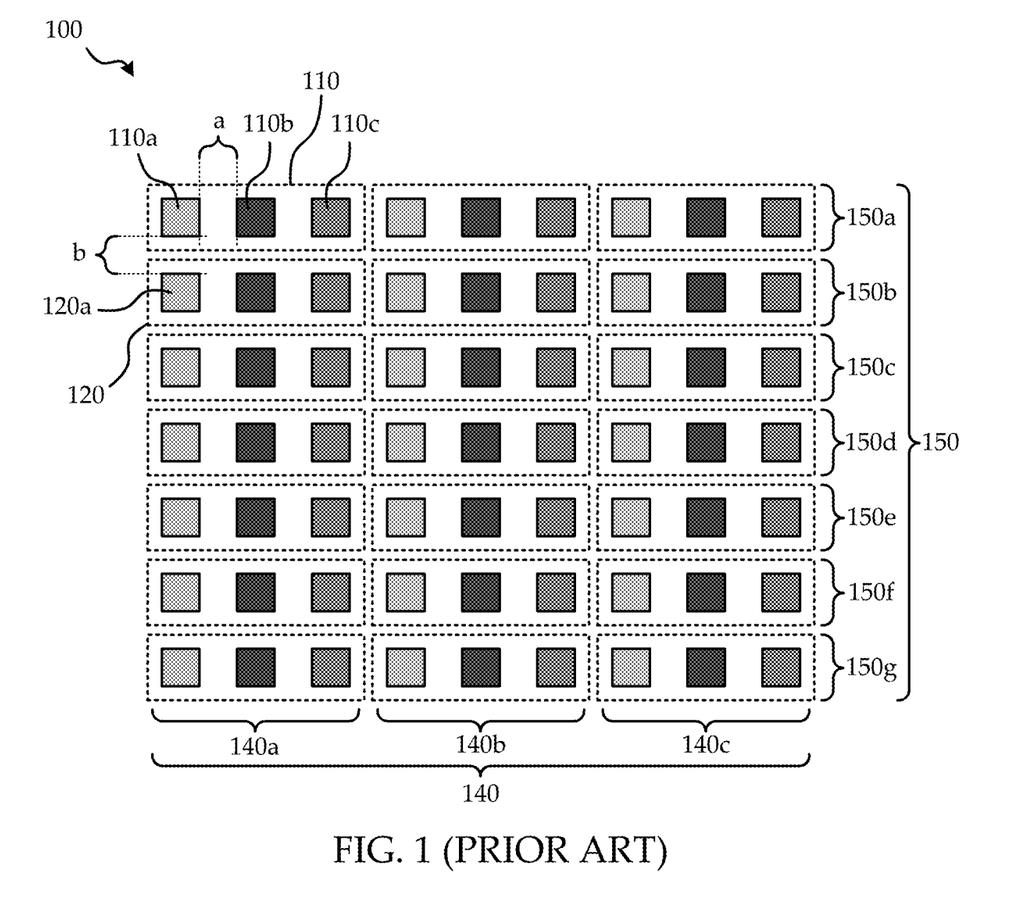
FIG. 1 illustrates a known pixel array arrangement.

Referring to FIG. 1, a known pixel array architecture 100 of a known display and its pixel pitch will now be discussed.

The known pixel array structure 100 is divided into an array of pixels 110, 120 (illustrated with dotted lines) arranged in individual rows 150a, . . . , 150g, collectively referred to as rows 150 of the display, as well as individual columns 140a, . . . , 140c, collectively referred to as columns 140 of the display. Each pixel 110 is comprised of a plurality of subpixels 110a, 110b, 110c, each of a different type which is responsible for providing a component, channel, or color of the pixel. In the pixel array structure 100 of FIG. 1, each pixel is composed of red, green, and blue subpixels, represented in shades of grey in no particular order.

A horizontal pixel pitch a is shown between a first subpixel 110a of the top left pixel 110 and its horizontally nearest neighbor subpixel 110b. A vertical pitch b is shown between the first subpixel 110a of the top left pixel 110 and its vertically nearest neighbor subpixel 120a of the pixel 120 below the top left pixel 110. A minimum pixel pitch is defined as the lesser of a and b.

Known pixel array structures 100 have subpixels 110a of various shapes and sizes. As shown in the figure the pixel pitch is calculated from the outermost portion of the subpixels 110a defining the vertical or horizontal spacing between them. In a case such as depicted where the pixels, and subpixels are each rectangular and arranged in a rectilinear array, the horizontal and vertical pixel pitch may be simply expressed.

To characterize the array structure for a generic case, pixel size and shape will first be ignored to determine a maximum possible pixel pitch given the array structure. Given a rectilinear subpixel matrix having a vertical spacing B between centers of nearest neighbor subpixels, and a horizontal spacing A between centers of nearest neighbor subpixels, the maximum pitches possible, in the limit of vanishing subpixel size, is the minimum of A and B. In a square subpixel matrix, where A and B are equal to a single subpixel matrix element spacing D, the maximum possible pixel pitch is D.

In the specific case illustrated in FIG. 1, of an array of pixels having square pixels of width w, where w is smaller than D and may be expressed as k*D, the horizontal pitch a equals vertical pitch b and is equal to the spacing D minus the width w; or D−w. Expressing w in terms of D the pixel pitch (PP) for the pixel array structure 100 is: PP=D*(1−k).

Figure 2:
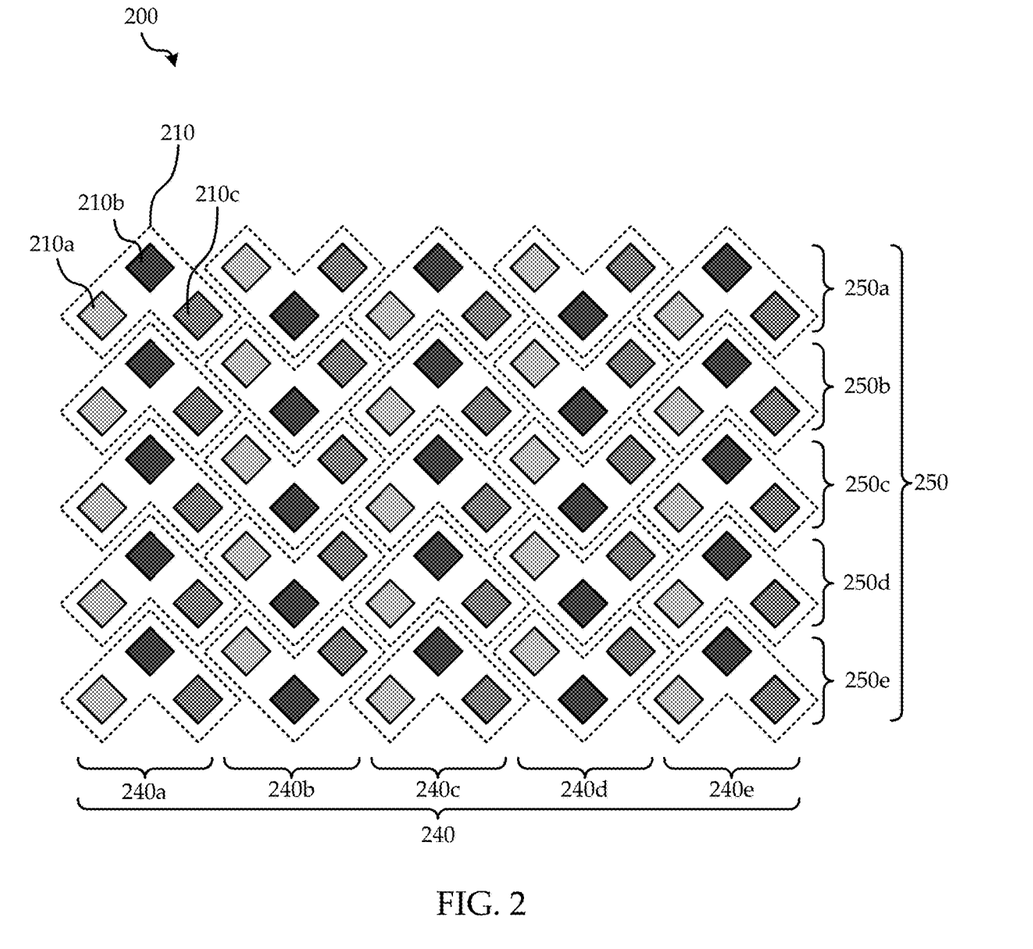
FIG. 2 illustrates a first high density pixel array architecture.

Referring to FIG. 2, a pixel array architecture 200 of a first embodiment will now be discussed.

The pixel array architecture 200 is divided into an array of pixels 210 arranged in individual rows 250a, . . . , 250e, collectively referred to as rows 250 of the display, as well as individual columns 240a, . . . , 240e, collectively referred to as columns 240 of the display. Each pixel 210 is comprised of a plurality of subpixels 210a, 210b, 210c, each of a different type which is responsible for providing a component, channel, or color of the pixel. In the pixel array architecture 200 of FIG. 2, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 200 each pixel 210 has subpixels 210a, 210b, 210c, in a similar configuration to that of all the other pixels. This leads to a subpixels of the same color or type of subpixel 210a, 220a being arranged in subpixel columns within the pixel columns 240a. Other embodiments possess pixels 210 each having subpixels 210a, 210b, 210c in different configurations which may or may not result in the formation of columns of subpixels of the same type.

The pixel array architecture of FIG. 2 is based on a diamond shaped subpixel matrix, which is a rectilinear matrix rotated by 45 degrees. Each pixel is defined from three subpixels 210a, 210b, 210c, in a "v" or upside-down "v" configuration. Each column 240a, . . . 240e comprises either pixels in the "v" configuration arranged one atop the other or pixels in the upside-down "v" configuration arranged one atop the other. Adjacent columns 240 alternate between those 240b, 240e having pixels with a "v" configuration and those 240a, 240c, 240e having pixels with an upside-down "v" configuration.

Figure 3:
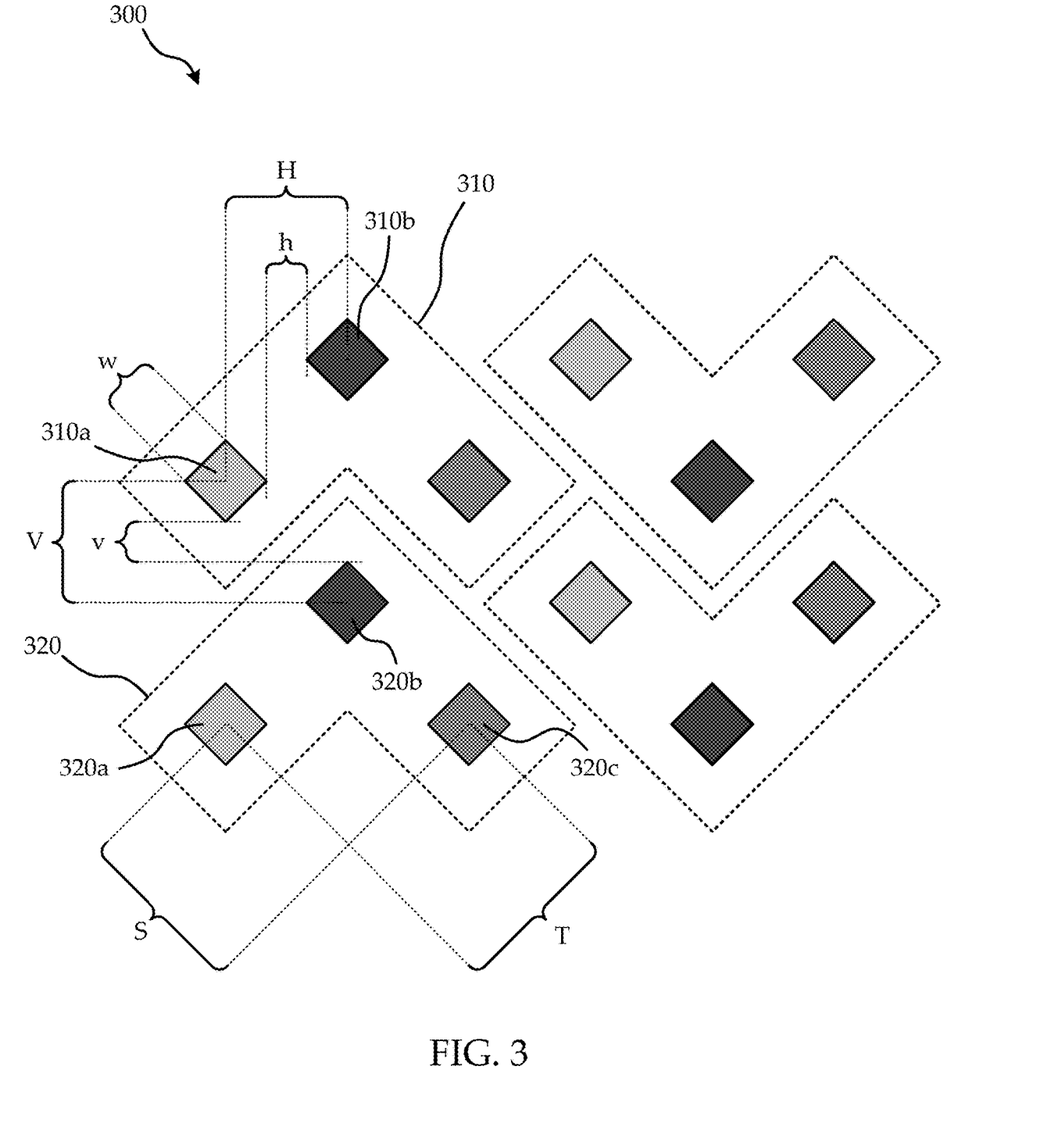
FIG. 3 is close-up view of the high density pixel array architecture of FIG. 2.

Referring now also to FIG. 3 a pixel pitch of the pixel array architecture of FIG. 3 will now be discussed.

A horizontal pixel pitch h is shown between a first subpixel 310a of the top left pixel 310 and its horizontally nearest neighbor subpixel 310b. A vertical pitch v is shown between the first subpixel 310a of the top left pixel 310 and its vertically nearest neighbor subpixel 320b of the pixel 320 below the top left pixel 310. A minimum pixel pitch is defined as the lesser of h and v.

Pixel array architecture 300 may have subpixels 310a of various shapes and sizes. As shown in the figure the pixel pitch is calculated from the outermost portion of the subpixels 310a defining the vertical or horizontal spacing between them. In a case such as depicted where the pixels, and subpixels are each based on a 45 degree rotation of rectangular pixels and subpixels arranged in a rectilinear array, the horizontal and vertical pixel pitch may be simply expressed.

To characterize the array structure for a generic case, pixel size and shape will first be ignored to determine a maximum possible pixel pitch given the array architecture. Given a 45 degree rotated rectilinear subpixel matrix having a first spacing S between centers of nearest neighbor subpixels, and a second spacing T (at right angles to the first spacing) between centers of nearest neighbor subpixels, the maximum pitches possible, in the limit of vanishing subpixel size, is the minimum of $S*(½)^{1/2}$ and $T*(½)^{1/2}$. In a rotated square subpixel matrix, where S and T are equal to a single subpixel matrix element spacing D, the maximum possible pixel pitch is $D*(½)^{1/2}$. In the limit of small to vanishing subpixel sizes, the largest possible pixel pitch is ~0.7 times that of the unrotated known pixel array structure of FIG. 1, representing a higher density according to the accepted definition of the pixel pitch performance metric.

In the specific case illustrated of an array of pixels having square pixels (rotated 45 degrees) of width w, where w is smaller than D and may be expressed as k*D, the horizontal pitch h is equal to the horizontal spacing H minus $w*2^{1/2}$, or $H-w*2^{1/2}$, and the vertical pitch v is equal to the vertical spacing V minus $w*2^{1/2}$, or $V-w*2^{1/2}$. In an embodiment where S and T are equal to a single subpixel matrix element spacing D, H equals V and has a value of $D*(½)^{1/2}$. In such a case the vertical and horizontal pitches v and h are equal to a single pixel pitch. Expressing w in terms of D, the pixel pitch (PP) for the pixel array architecture 200 is: $PP=D*(½)^{1/2}*(1-2k)$. It should be noted that when k is 0.5 the pixel pitch goes to zero.

The ratio of the pixel pitch of the pixel array architecture 200 of FIG. 2 to that of the pixel array structure 100 of FIG. 1 is $D*(½)^{1/2}*(1-2k)/D*(1-k)$ which equals $(½)^{1/2}*(1-2k)/(1-k)$. This value is at most $(½)^{1/2}$ (which roughly equals 0.7) when k vanishes, and is zero when k is 0.5. As such, the pixel pitch of the pixel array architecture 200 is at most 0.7 of that of the pixel array structure 100, and may take on values less than that depending upon the ratio of to D.

It should be clear that the achieving of lower vertical and horizontal pixel pitch through use of a 45 degree rotated rectilinear subpixel matrix, when compared to an unrotated rectilinear matrix, does not generally depend upon the pixel size, shape, or the particular unrotated horizontal and vertical spacing of the subpixel matrix. As such, each of the following embodiments, utilizing such a rotated subpixel matrix, will exhibit improved pixel pitch performance metrics in a substantially similar manner to that illustrated above, regardless of the subpixel shape and the particular way the subpixels are grouped into pixels, columns, and rows. It also should be understood that some angle other than 45 degrees can reduce pixel pitch in accordance with the above discussion.

Figure 4:
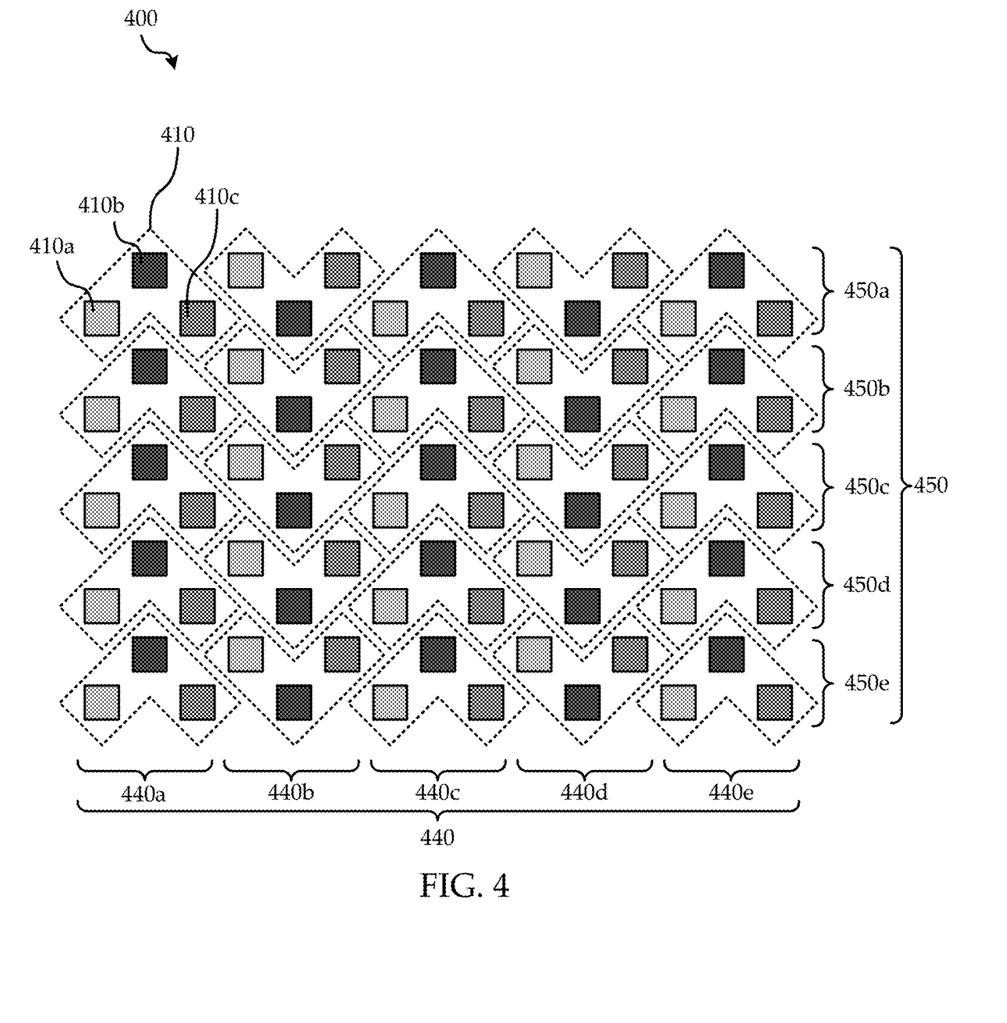
FIG. 4 illustrates a variation of the first high density pixel array architecture of FIG. 2.

Referring to FIG. 4, a pixel array architecture 400 of a variation on the first embodiment will now be discussed.

The pixel array architecture 400 is divided into an array of pixels 410 arranged in individual rows 450a, . . . , 450e, collectively referred to as rows 450 of the display, as well as individual columns 440a, . . . , 440e, collectively referred to as columns 440 of the display. Each pixel 410 is comprised of a plurality of subpixels 410a, 410b, 410c, each of a different type which is responsible for providing a component, channel, or color of the pixel. In the pixel array architecture 400 of FIG. 4, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 400 each pixel 410 has subpixels 410a, 410b, 410c, in a similar configuration to that of all the other pixels. This leads to a subpixels of the same color or type of subpixel being arranged in subpixel columns within the pixel columns 440a. Other embodiments possess pixels 410 each having subpixels 410a, 410b, 410c in different configurations which may or may not result in the formation of columns of subpixels of the same type.

The pixel array architecture 400 of FIG. 4 differs from that of the first embodiment of FIG. 2, by use of square subpixels whose sides are parallel to the vertical and horizontal directions of the display rather than rotated at 45 degrees as is the case for the subpixels of FIG. 2.

Similar to the pixel array architecture of FIG. 2 that of FIG. 4 is based on a diamond shaped subpixel matrix, which is a rectilinear matrix rotated by 45 degrees. Each pixel is defined from three subpixels 410a, 410b, 410c, in a "v" or upside-down "v" configuration. Each column 440a, . . . 440e comprises either pixels in the "v" configuration arranged one atop the other or pixels in the upside-down "v" configuration arranged one atop the other. Adjacent columns 440 alternate between those 440b, 440e having pixels with a "v" configuration and those 440a, 440c, 440e having pixels with an upside-down "v" configuration.

Figure 5:
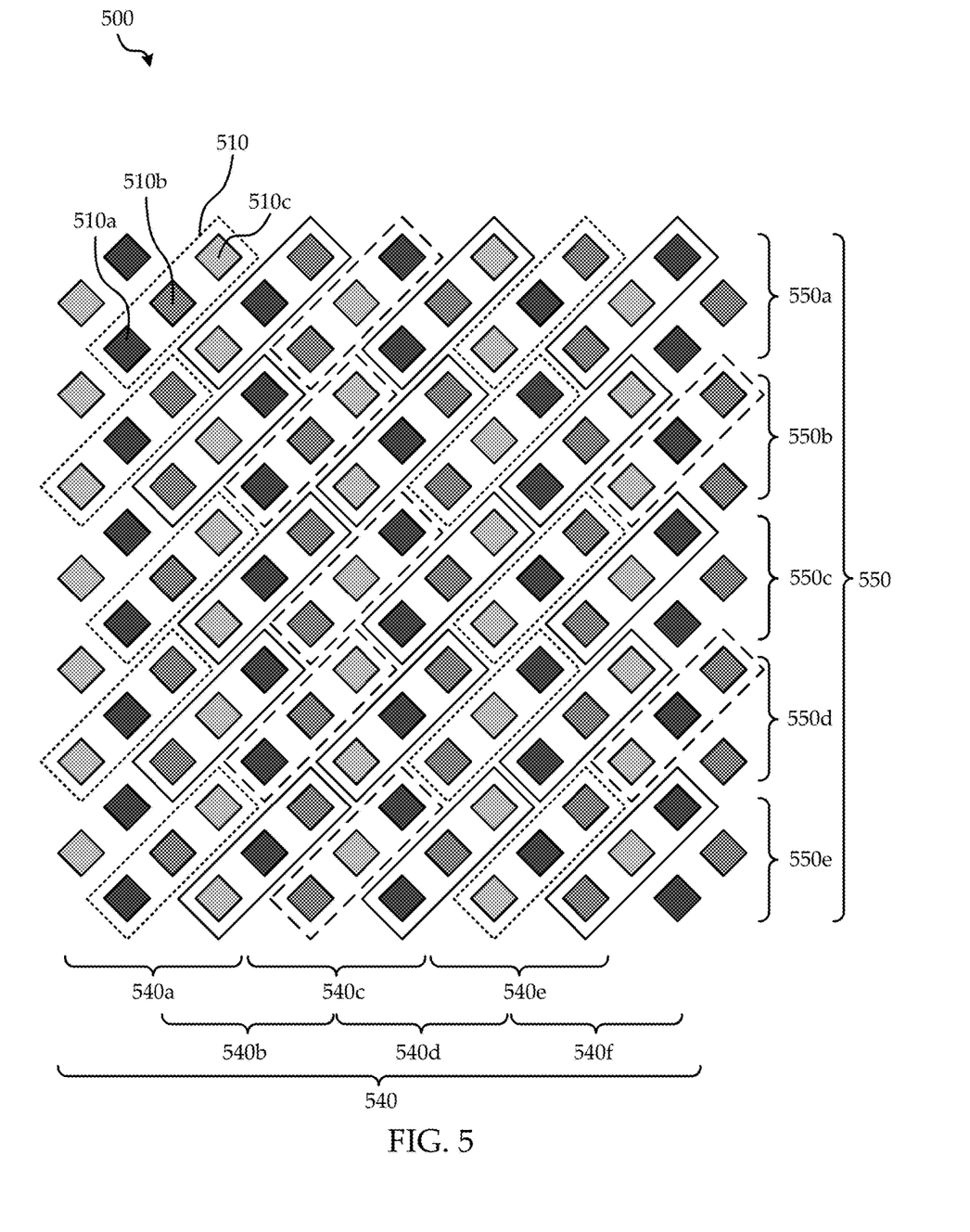
FIG. 5 illustrates a second high density pixel array architecture.

Referring to FIG. 5, a pixel array architecture 500 of a second embodiment will now be discussed.

The pixel array architecture 500 is divided into an array of pixels 510 arranged in individual rows 550a, . . . , 550e, collectively referred to as rows 550 of the display, as well as individual overlapping columns 540a, . . . , 540f, collectively referred to as columns 540 of the display. Each pixel 510 is comprised of a plurality of subpixels 510a, 510b, 510c, each of a different type which is responsible for providing a component, channel, or color of the pixel. In the pixel array architecture 500 of FIG. 5, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 500 each pixel 510 has subpixels 510a, 510b, 510c, in various different orders within a similar configuration. It so happens that subpixels of the same color or type of subpixel are arranged in subpixel columns within the pixel columns 540a even though pixels have various subpixel distributions within them.

Similar to the pixel array architecture of FIG. 2 that of FIG. 5 is based on a diamond shaped subpixel matrix, which is a rectilinear matrix rotated by 45 degrees.

The pixel array architecture 500 of FIG. 5 differs from that of FIG. 2 in how subpixels are arranged into pixels 510. Each pixel is defined from three subpixels 510a, 510b, 510c, in a slanted "I" configuration, each pixel slanting at 45 degrees. Each column 540a, . . . 540f comprises pixels in the "I" configuration arranged in groups of two one atop each other and overlapping only by two subpixels, with a vertical gap of a single subpixel in height between groups, the gap having a subpixel of a pixel of each neighboring column. For example, column 540c (illustrated with dashed lines) includes groups of two pixels, overlapping horizontally (from a vertical perspective) by two subpixels, each group separated by a slanting gap, which in the overlap region includes a subpixel of a pixel of the adjacent column 540b, and a subpixel of a pixel of the adjacent column 540d.

Figure 6:
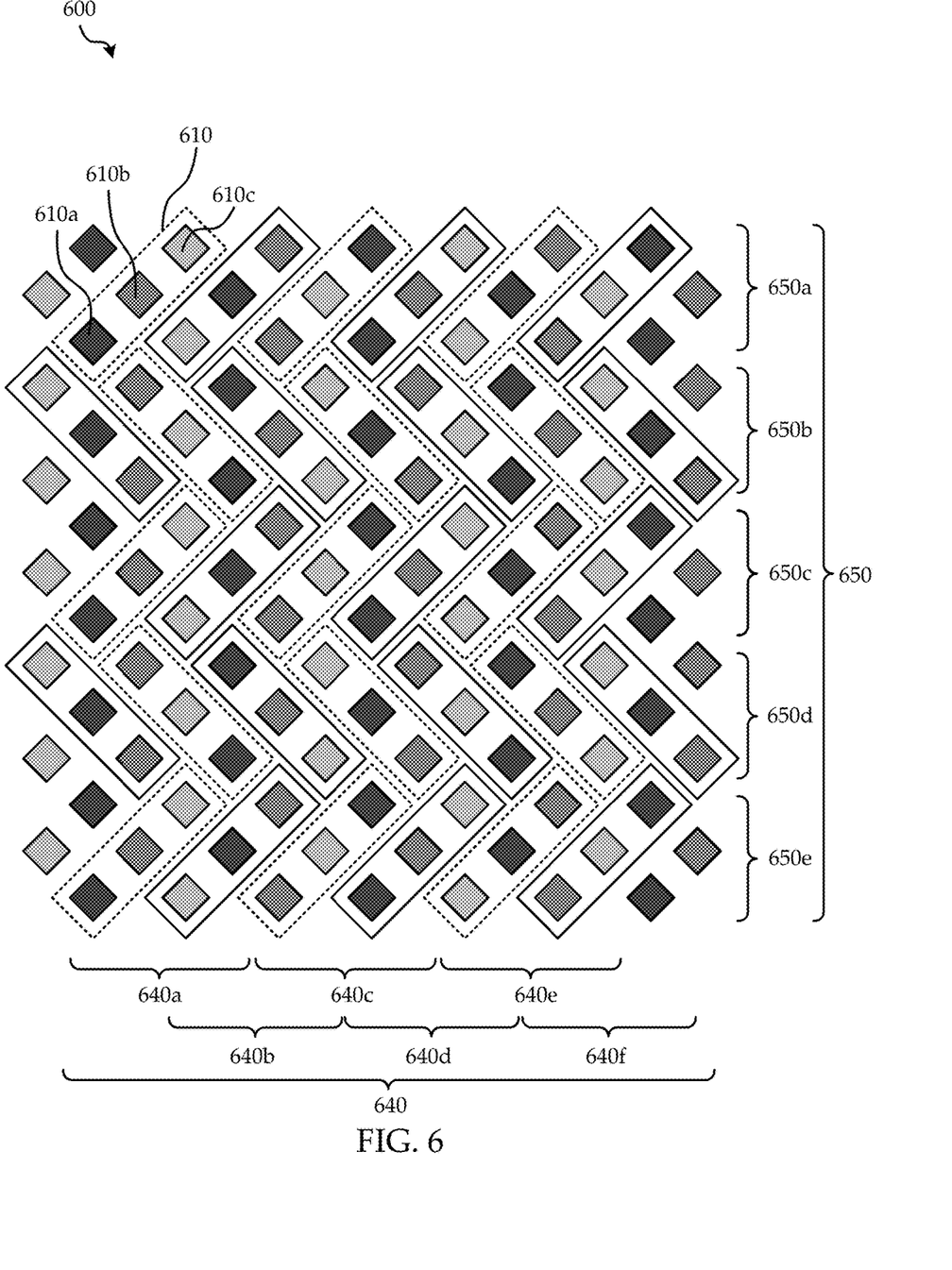
FIG. 6 illustrates a third high density pixel array architecture.

Referring to FIG. 6, a pixel array architecture 600 of a third embodiment will now be discussed.

The pixel array architecture 600 is divided into an array of pixels 610 arranged in individual rows 650a, . . . , 650e, collectively referred to as rows 650 of the display, as well as individual overlapping columns 640a, . . . , 640f, collectively referred to as columns 640 of the display. Each pixel 610 is comprised of a plurality of subpixels 610a, 610b, 610c, each of a different type which is responsible for providing a component, channel, or color of the pixel. In the pixel array architecture 600 of FIG. 6, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 600 each pixel 610 has subpixels 610a, 610b, 610c, in various different orders within a similar configuration. It so happens that subpixels of the same color or type of subpixel are arranged in subpixel columns within the pixel columns 640a even though pixels have various subpixel distributions within them.

Similar to the pixel array architecture of FIG. 2 that of FIG. 6 is based on a diamond shaped subpixel matrix, which is a rectilinear matrix rotated by 45 degrees.

The pixel array architecture 600 of FIG. 6 differs from that of FIG. 2 in how subpixels are arranged into pixels 610. Similar to the embodiment of FIG. 5 each pixel is defined from three subpixels 610a, 610b, 610c, in a slanted "I" configuration, each pixel slanting at positive or negative 45 degrees. Different from the embodiment of FIG. 5 is the inclusion of pixels which slant in different directions, i.e. of opposite slope. Each column 640a, . . . 640f comprises pixels in the "I" configuration arranged one atop each other, alternating in slant form one direction (negative slope) to the other direction (positive slope), and overlapping only by two subpixels, with no vertical gap, but forming a snaking vertical pattern. Moreover, the pixel outline structure of each column is identical to that of its adjacent columns.

Figure 7:
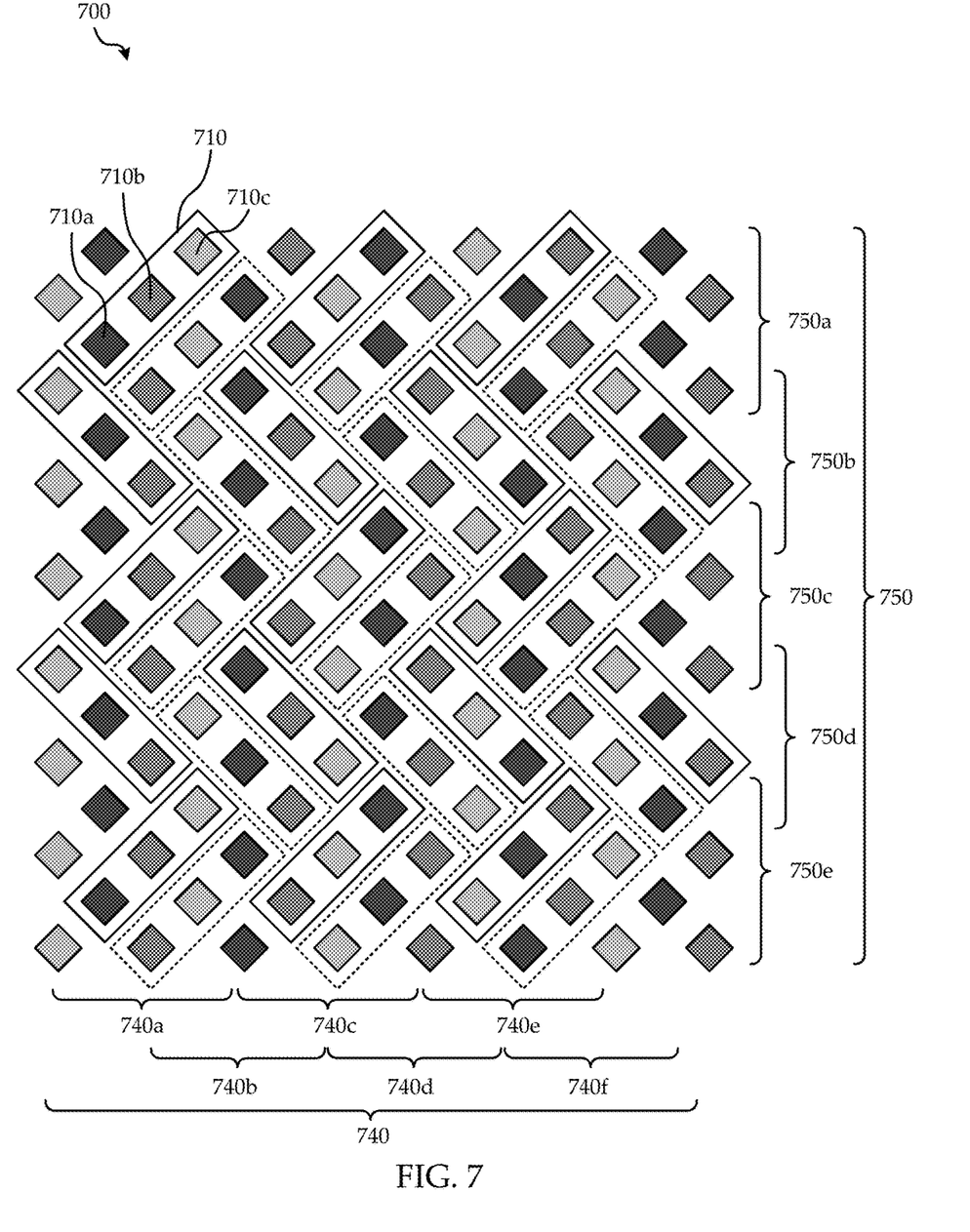
FIG. 7 illustrates a fourth high density pixel array architecture.

Referring to FIG. 7, a pixel array architecture 700 of a fourth embodiment will now be discussed.

The pixel array architecture 700 is divided into an array of pixels 710 arranged in individual overlapping rows 750a, . . . , 750e, collectively referred to as rows 750 of the display, as well as individual overlapping columns 740a, . . . , 740f, collectively referred to as columns 740 of the display. Each pixel 710 is comprised of a plurality of subpixels 710a, 710b, 710c, each of a different type which is responsible for providing a component, channel, or color of the pixel. In the pixel array architecture 700 of FIG. 7, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 700 each pixel 710 has subpixels 710a, 710b, 710c, in various different orders within a similar configuration. It so happens that subpixels of the same color or type of subpixel are arranged in subpixel columns within the pixel columns 740a even though pixels have various subpixel distributions within them.

Similar to the pixel array architecture of FIG. 2 that of FIG. 7 is based on a diamond shaped subpixel matrix, which is a rectilinear matrix rotated by 45 degrees.

The pixel array architecture 700 of FIG. 7 differs from that of FIG. 2 in how subpixels are arranged into pixels 710. Similar to the embodiment of FIG. 7 each pixel is defined from three subpixels 710a, 710b, 710c, in slanted "I" configurations slanting in different directions, each pixel slanting at positive or negative 45 degrees. Each column 740a, . . . 740f comprises pixels in the "I" configuration arranged one atop each other, alternating in slant form one direction (negative 45 degree slope) to the other direction (positive 45 degree slope), and overlapping only by two subpixels, with no vertical gap, but forming a snaking vertical pattern. In this embodiment, as opposed to that of FIG. 6, the pixel outline structure of each column is not identical to that of its adjacent columns. In the snaking pattern of one column, an upper pixel sits atop the pixel below it on the longest side of the pixel below, while in an adjacent column, the upper pixel sits atop the pixel below it on the shortest side of the pixel below. This results in a slightly different pattern having overlapping rows 750a, . . . , 750e.

Figure 8:
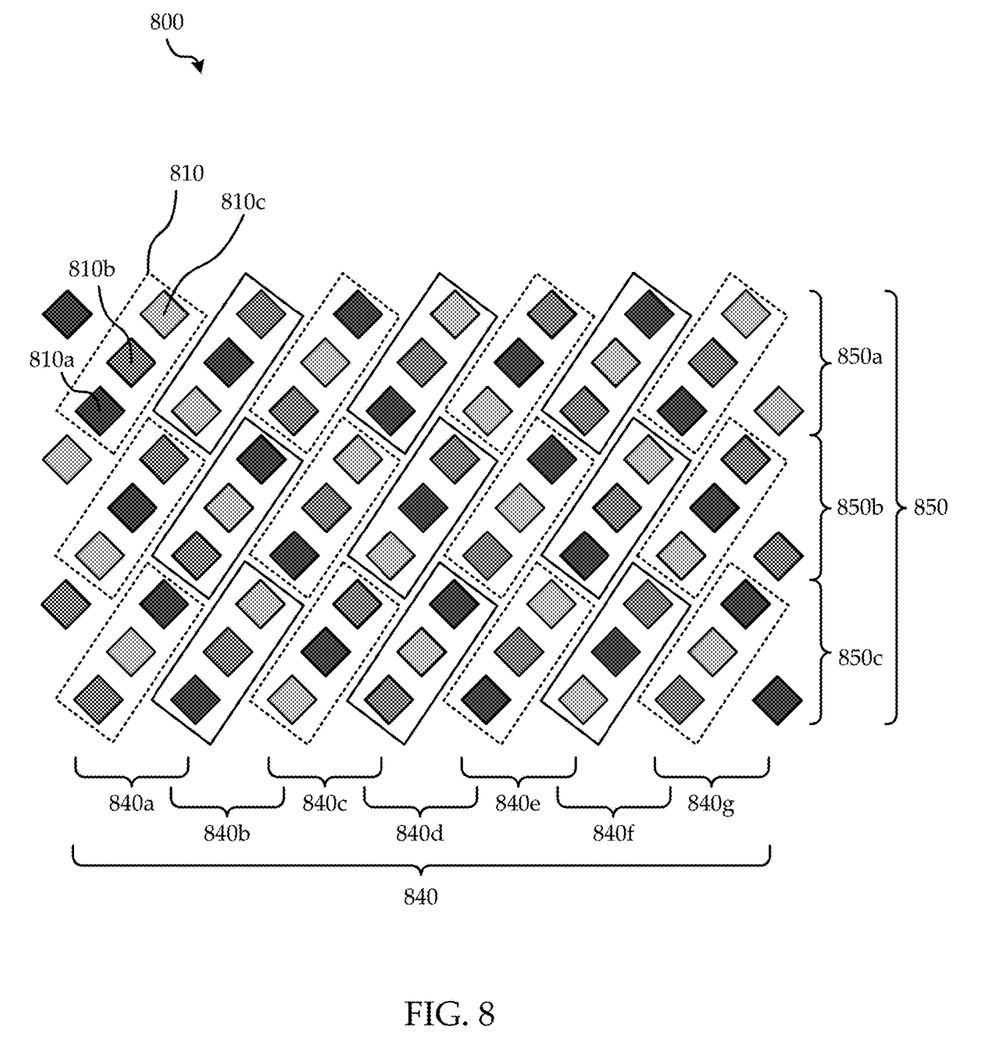
FIG. 8 illustrates a fifth high density pixel array architecture.
Figure 9:
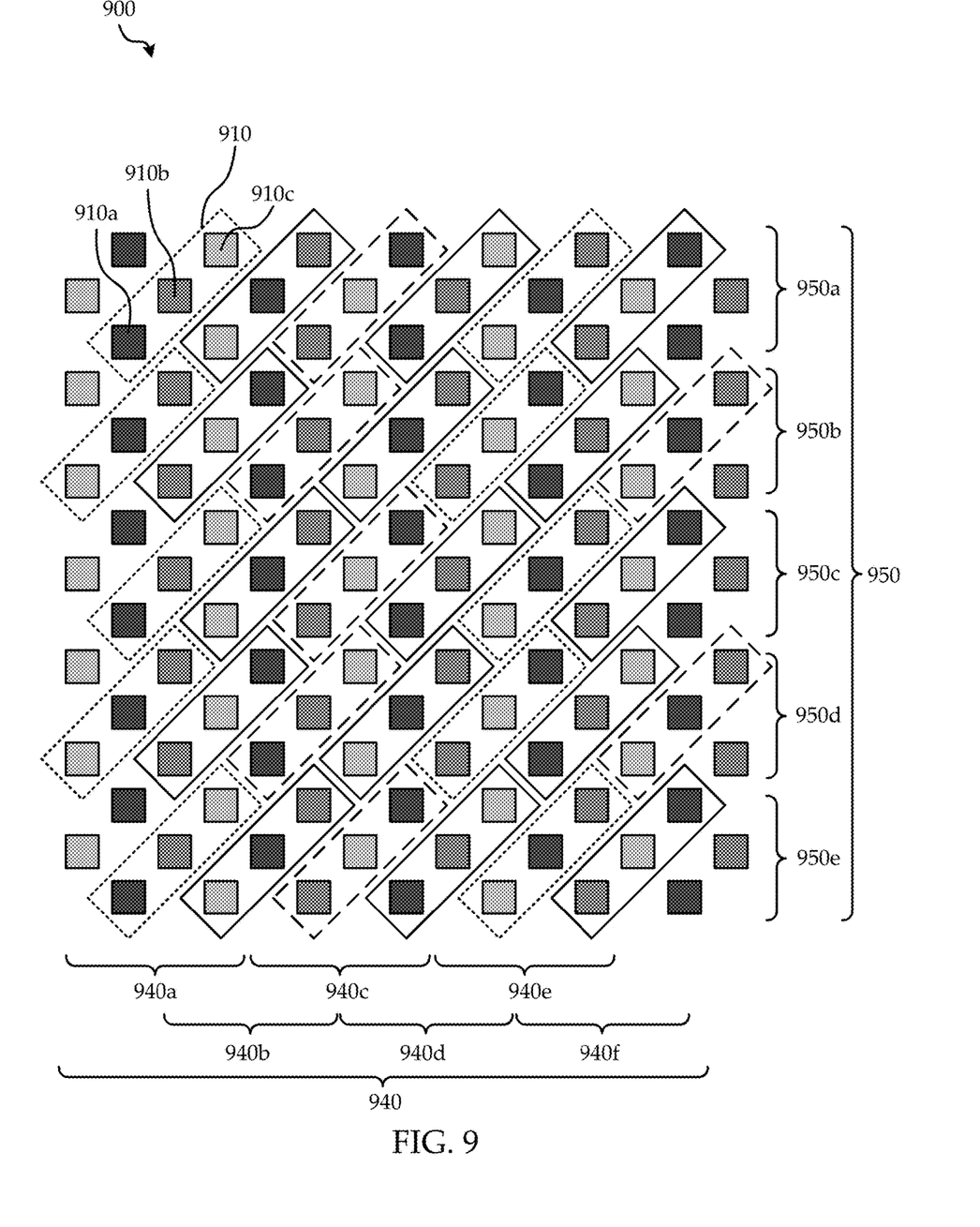
FIG. 9 illustrates a variation of the second high density pixel array architecture.
Figure 10:
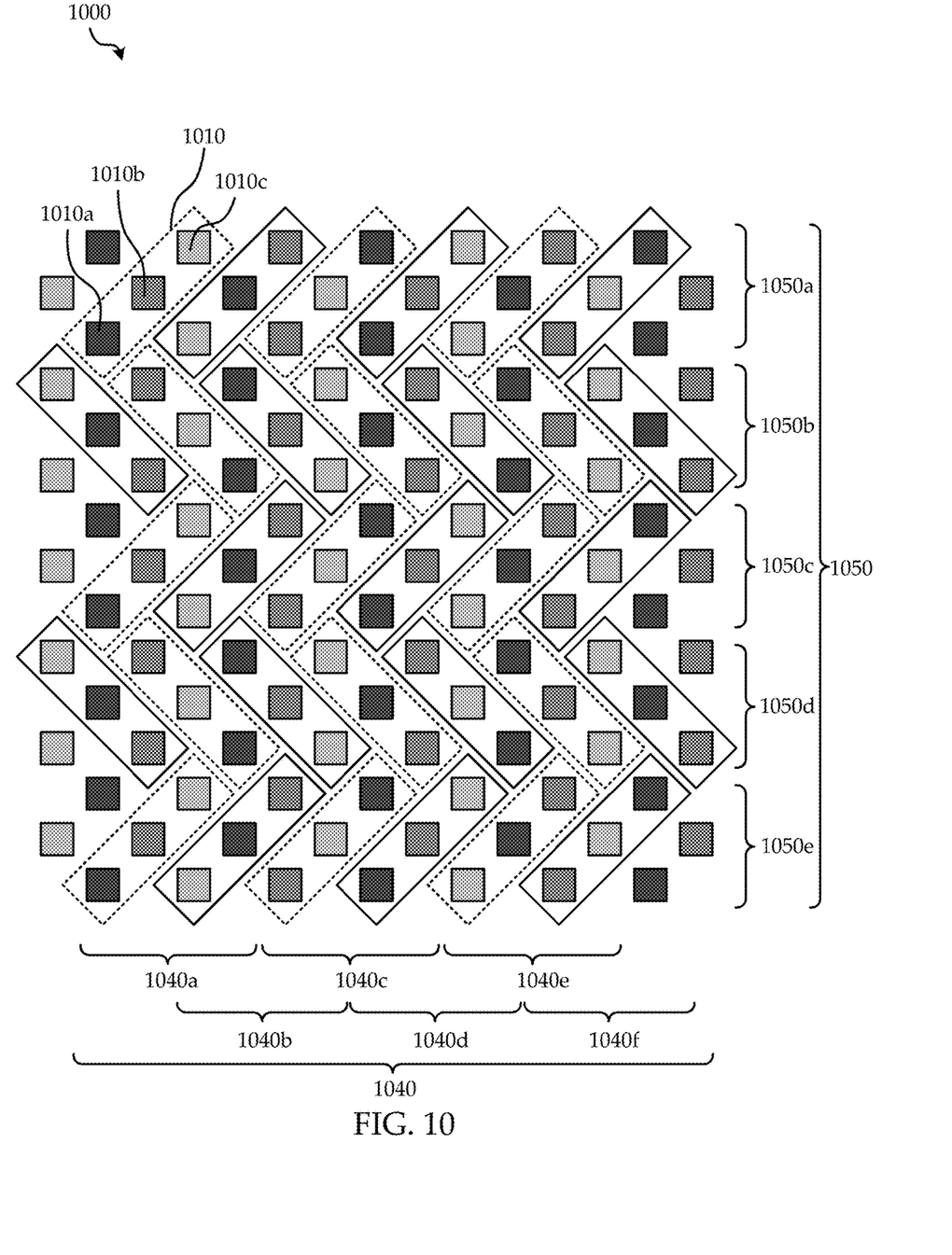
FIG. 10 illustrates a variation of the third high density pixel array architecture.
Figure 11:
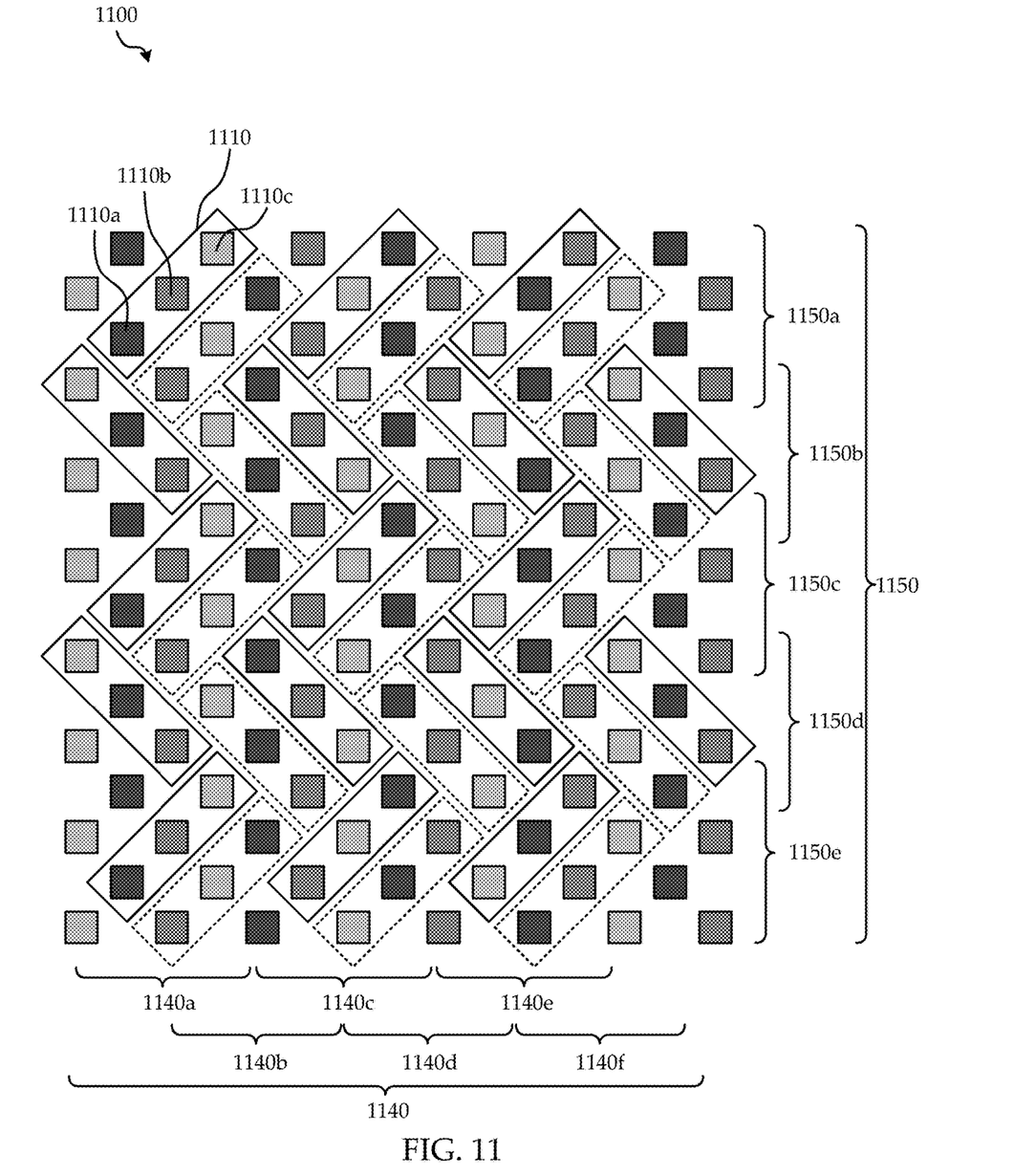
FIG. 11 illustrates a variation of the fourth high density pixel array architecture.
Figure 12:
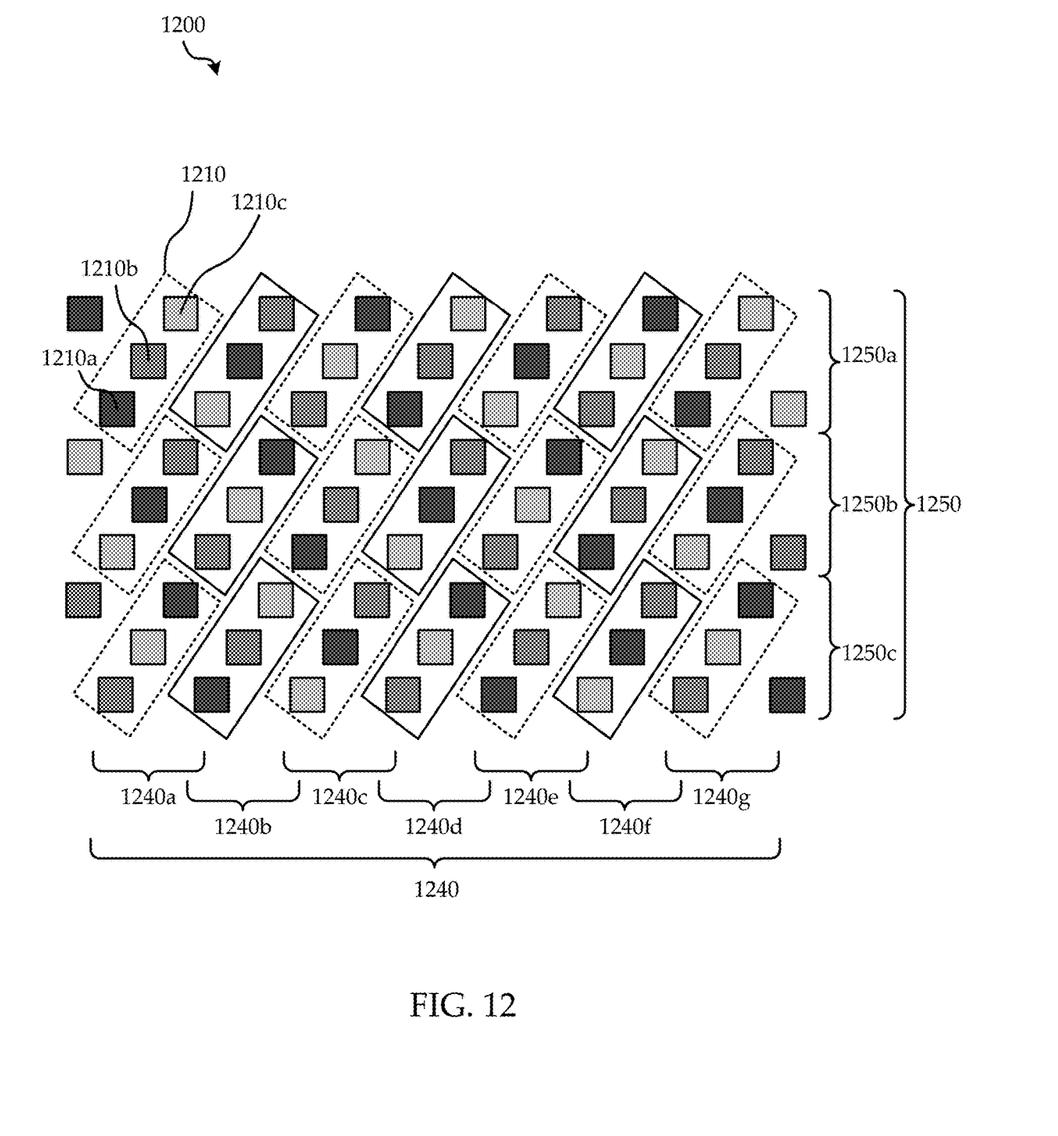
FIG. 12 illustrates a variation of the fifth high density pixel array architecture.

Referring to FIG. 8, a pixel array architecture 800 of a fifth embodiment will now be discussed.

The pixel array architecture 800 is divided into an array of pixels 810 arranged in individual rows 850a, . . . , 850c, collectively referred to as rows 850 of the display, as well as individual overlapping columns 840a, . . . , 840g, collectively referred to as columns 840 of the display. Each pixel 810 is comprised of a plurality of subpixels 810a, 810b, 810c, each of a different type which is responsible for providing a component, channel, or color of the pixel. In the pixel array architecture 800 of FIG. 8, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 800 each pixel 810 has subpixels 810a, 810b, 810c, in various different orders within a similar configuration. It so happens that subpixels of the same color or type of subpixel are arranged in subpixel columns within the pixel columns 840a even though pixels have various subpixel distributions within them.

Similar to the pixel array architecture of FIG. 2 that of FIG. 5 is based on a diamond shaped subpixel matrix, which is a rectilinear matrix rotated by 45 degrees, but with a further skew or parallelogram transformation to bring the defined pixels into columns in the vertical direction.

The pixel array architecture 800 of FIG. 8 is similar to that of FIG. 5 in that each pixel is defined from three subpixels 810a, 810b, 810c, in a slanted "I" configuration. It differs from that of FIG. 5 in that the pixels, by virtue of the skewed array, can be arranged atop one another in slightly overlapping vertical columns 840a, . . . , 840g. In particular every subpixel is vertically aligned with subpixels in every third subpixel row, i.e. each subpixel of a pixel is aligned with the same positioned subpixel in the pixel below it.

FIG. 9, FIG. 10, FIG. 11, and FIG. 12, illustrate variations of embodiments respectively depicted in FIG. 5, FIG. 6, FIG. 7, and FIG. 8. Each of the pixel array architectures 900, 1000, 1100, and 1200 is substantially equivalent respectively to pixel array architecture 500, 600, 700, and 800 differing only by use of square subpixels whose sides are parallel to the vertical and horizontal directions of the display rather than rotated at 45 degrees as is the case for the subpixels of each of architectures 500, 600, 700, and 800 of respectively FIG. 5, FIG. 6, FIG. 7, and FIG. 8.

Figure 13:
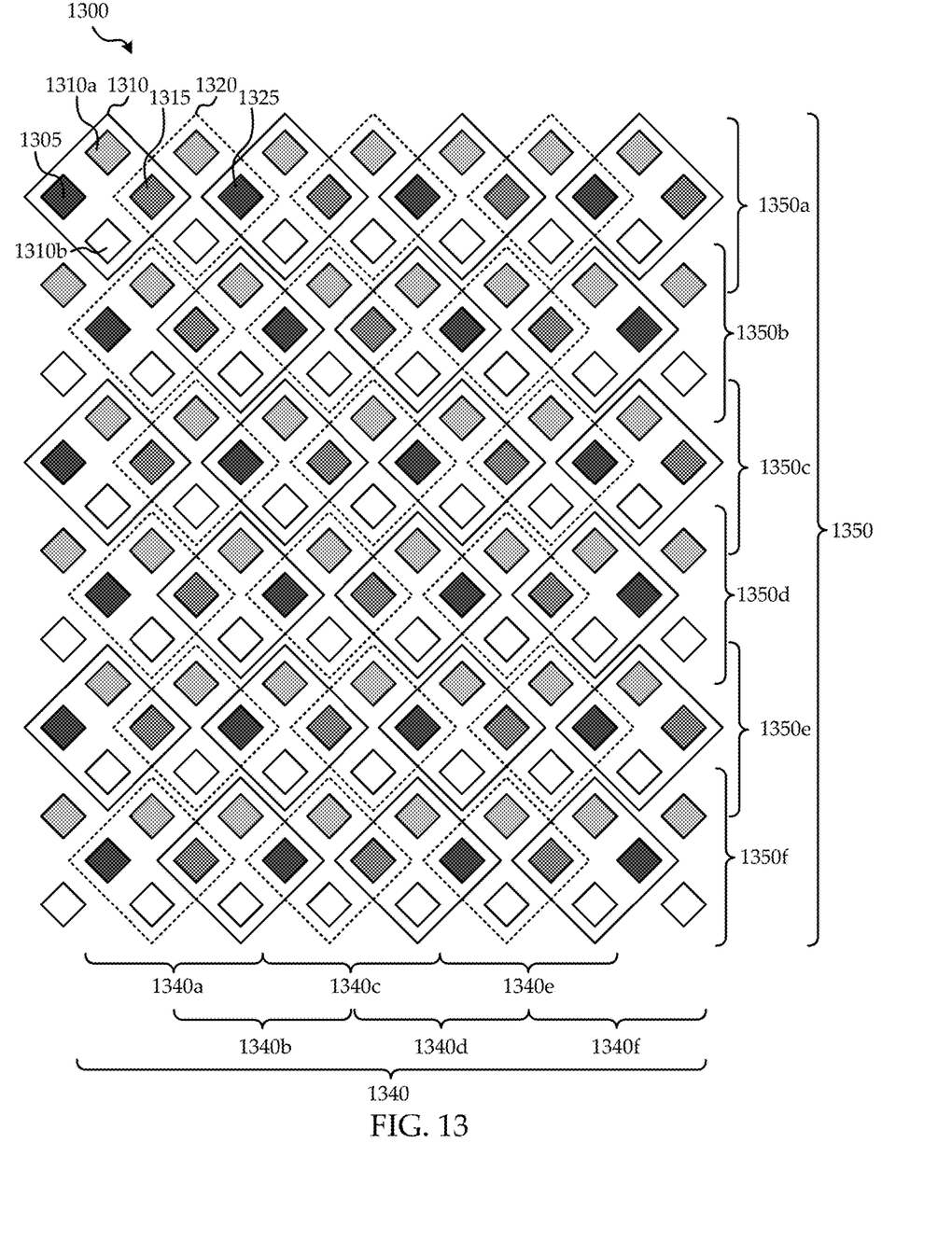
FIG. 13 illustrates a sixth high density pixel array architecture.

Referring to FIG. 13, a pixel array architecture 1300 of a sixth embodiment will now be discussed.

The pixel array architecture 1300 is divided into an array of pixels 1310, 1320 arranged in individual overlapping rows 1350a, ..., 1350f, collectively referred to as rows 1350 of the display, as well as individual overlapping columns 1340a, ..., 1340f, collectively referred to as columns 1340 of the display. Each pixel 1310 is comprised of a plurality of subpixels 1310a, 1310b, which it does not share with other pixels and a plurality of subpixels 1305, 1315 which it does share with other pixels. Within each pixel each subpixel is of a different type which is responsible for providing a component, channel, or color of the pixel.

In the pixel array architecture 1300 of FIG. 13, each pixel is composed of a green 1320a and a white 1310b unshared subpixel, as well as a shared red 1305 and a shared blue 1315 subpixel, each represented in a corresponding shade of grey. Because red and blue offer more color information on a typical display, they have been chosen as the shared pixels to minimize loss of information. It is to be understood that embodiments comprising pixels having subpixels other than red, green, blue, and white, or a number of subpixels other than four, are contemplated. It is also to be understood that subpixels of colors other than red or blue may be shared between pixels, that green and white subpixels may be shared, and that subpixels other than white and green may be unshared, including red and blue subpixels.

In the pixel array architecture 1300 each pixel 1310 has a green subpixel 1310a as its uppermost subpixel, a white subpixel 1310b as it lowermost subpixel and one of a red or a blue subpixel as its leftmost subpixel and the other of a red or blue subpixel as its rightmost subpixel. For example, in each row 1350a, ..., 1350f, pixels of alternating columns have alternating left-right configurations of red and blue subpixels.

The green and white subpixels of the pixel array architecture 1300 each form subpixel rows within each row 1350a, ..., 1350f, while the red and blue subpixels forms a subpixel row of alternating red and blue subpixels within each row 1350a, ..., 1350f.

The pixel array architecture of FIG. 13 is based on a diamond shaped subpixel matrix, which is a rectilinear matrix rotated by 45 degrees. Each pixel is defined from four subpixels 1310a, 1310b, 1305, 1315, in a diamond configuration. Each column 1340a, ... 1340f comprises pixels in the diamond configuration arranged one atop of the other in a snaking pattern, overlapping horizontally by two subpixels, from a vertical perspective. Adjacent columns 1340 snake in the same direction at each row.

Although pixels in the various embodiment have been depicted with particular orientations, it should be understood that equivalent orientations of each embodiment obtained by a reflection in the horizontal or vertical axis or a rotation of a multiple of 90 degrees is contemplated. For clarity an embodiment having an arrangement of "v" and an upside down "v" shaped pixels is equivalent to an embodiment with right opening "v" and left opening "v" shaped pixels.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. A display device comprising a matrix of subpixels grouped into pixels, the matrix of subpixels arranged in a substantially rectilinear matrix oriented at substantially a 45 degree angle relative to a major axis of the display, each pixel comprising a group of subpixels at positions of the rectilinear matrix forming a right angle shape.

2. The display device of claim 1, wherein the right angle shapes formed by the positions of the subpixels of each pixel are oriented in one of a first direction and a second direction opposite from the first direction.

3. The display device of claim 1, wherein the pixels are arranged in rows and columns and wherein the right angle shapes formed by the positions of the subpixels of each pixel in each column are oriented in opposite directions to the right angle shapes formed by the positions of the subpixels of each pixel in each adjacent column.

4. The display device of claim 1, wherein the pixels are arranged in rows and columns, and wherein the right angle shapes formed by the positions of the subpixels of each pixel in each column are oriented in opposite directions to the right angle shapes formed by the positions of the subpixels of each adjacent pixel in said column.

5. The display device of claim 1 wherein each subpixel is shaped substantially in the form of a square oriented at one of 0 degrees and 45 degrees from an axis of the rectilinear matrix of subpixels.

6. A display device comprising a matrix of subpixels grouped into pixels, the matrix of subpixels arranged in a substantially rectilinear matrix oriented at substantially a 45 degree angle relative to a major axis of the display, each pixel having a length unequal to a width of the pixel.

7. The display device of claim 6, wherein each pixel comprises a group of subpixels at positions of the rectilinear matrix arranged in a line.

8. This display device of claim 6, wherein the pixels are arranged in a repeating pattern along a first direction, in groups of pixels adjacent one another in the first direction with a gap in said first direction between groups, the gap including a subpixel of neighboring pixels adjacent the gap in directions perpendicular to the first direction.

9. The display device of claim 6 wherein each subpixel is shaped substantially in the form of a square oriented at one of 0 degrees and 45 degrees from an axis of the rectilinear matrix of subpixels.

10. A display device comprising a matrix of subpixels grouped into pixels, the matrix of subpixels arranged in a substantially rectilinear matrix oriented at substantially a 45 degree angle relative to a major axis of the display, said pixels comprising first pixels slanted at a positive 45 degree slope relative to a major axis of the display and second pixels slanted at a negative 45 degree slope relative to the major axis of the display.

11. The display device of claim 10, wherein each pixel comprises a group of subpixels at positions of the rectilinear matrix arranged in a line.

12. The display device of claim 10, wherein the first and second pixels are arranged in repeating patterns, the pixels adjacent each other along a length of each repeating pattern alternating in slant from negative 45 degrees to positive 45 degrees and forming a pattern along the length of the repeating pattern identical in geometry to a pattern of adjacent repeating patterns.

13. The display device of claim 10, wherein each subpixel is shaped substantially in the form of a square oriented at one of 0 degrees and 45 degrees from an axis of the rectilinear matrix of subpixels.

14. The display device of claim 10, wherein the first and second pixels are arranged in repeating patterns, the pixels adjacent each other along a length of each repeating pattern alternating in slant from negative 45 degrees to positive 45 degrees, and forming a pattern along the length of the repeating pattern, wherein for one of each pair of adjacent repeating patterns, each pixel meets an adjacent pixel in a first direction within the repeating pattern on a longest side of the adjacent pixel, and wherein for the other of each pair of adjacent repeating patterns, each pixel meets an adjacent pixel in the first direction within the repeating pattern on a shortest side of the adjacent pixel.

15. The display device architecture of claim 14, wherein each subpixel is shaped substantially in the form of a square oriented at one of 0 degrees and 45 degrees from an axis of the rectilinear matrix of subpixels.

16. A display device comprising a matrix of subpixels grouped into pixels, the matrix of subpixels arranged in a substantially rectilinear matrix oriented at substantially a 45 degree angle relative to a major axis of the display, each pixel formed into a diamond shape, a first and a second of the subpixels of each pixel shared with neighboring pixels, at least one other subpixel of the pixel unshared with neighboring pixels.

17. The display device of claim 16, wherein the pixels are arranged in repeating patterns, the pixels adjacent each other along a length of each repeating pattern forming a repeating pattern identical in geometry to a pattern of adjacent repeating patterns, the two subpixels of each pixel in the repeating pattern which are closest to the adjacent repeating pattern on either side of the repeating pattern being shared with respective pixels of the adjacent repeating patterns.

18. The display device of claim 17 wherein the unshared subpixels of each pixel comprise a green subpixel and a white subpixel and wherein the shared subpixels of each pixel comprise a red subpixel and a blue subpixel.

19. A display device comprising a matrix of subpixels grouped into pixels, the matrix of subpixels arranged in a skewed rectilinear matrix having positions corresponding to a rectilinear matrix at a 45 degree angle relative to a major axis of the display skewed either to vertically align subpixels in every third subpixel row or to horizontally align subpixels in every third subpixel column.

* * * * *